US012002783B2

(12) United States Patent
Song et al.

(10) Patent No.: US 12,002,783 B2
(45) Date of Patent: Jun. 4, 2024

(54) METHODS OF MANUFACTURING SEMICONDUCTOR DEVICE WITH BUMP INTERCONNECTION

(71) Applicant: SK hynix Inc., Icheon-si (KR)

(72) Inventors: Jun Yong Song, Icheon-si (KR); Kang Hun Kim, Icheon-si (KR); Si Yun Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 17 days.

(21) Appl. No.: 17/548,205

(22) Filed: Dec. 10, 2021

(65) Prior Publication Data
US 2023/0034877 A1 Feb. 2, 2023

(30) Foreign Application Priority Data

Aug. 2, 2021 (KR) .................... 10-2021-0101168

(51) Int. Cl.
*H01L 23/00* (2006.01)
(52) U.S. Cl.
CPC ............ *H01L 24/81* (2013.01); *H01L 24/05* (2013.01); *H01L 24/11* (2013.01); *H01L 24/13* (2013.01); *H01L 2224/0401* (2013.01); *H01L 2224/05555* (2013.01); *H01L 2224/10175* (2013.01); *H01L 2224/11013* (2013.01); *H01L 2224/1146* (2013.01); *H01L 2224/13018* (2013.01); *H01L 2224/13019* (2013.01); *H01L 2224/13076* (2013.01); *H01L 2224/13147* (2013.01); *H01L 2224/16135* (2013.01); *H01L 2224/16268* (2013.01); *H01L 2224/81385* (2013.01); *H01L 2224/81815* (2013.01); *H01L 2924/01047* (2013.01); *H01L 2924/0105* (2013.01); *H01L 2924/01079* (2013.01); *H01L 2924/014* (2013.01)

(58) Field of Classification Search
CPC ......... H01L 24/05; H01L 24/10; H01L 24/11; H01L 24/13; H01L 24/16; H01L 24/81; H01L 2224/10175; H01L 2224/11013; H01L 2224/13018; H01L 2224/13019; H01L 2224/13076; H01L 2224/16135; H01L 2224/16268; H01L 2224/81385; H01L 2224/81815
See application file for complete search history.

(56) References Cited

U.S. PATENT DOCUMENTS 9,806,045 B2 * 10/2017 Lu ..................... H01L 24/09

FOREIGN PATENT DOCUMENTS

KR 1020160095520 A 8/2016

* cited by examiner

*Primary Examiner* — Marcos D. Pizarro
(74) *Attorney, Agent, or Firm* — WILLIAM PARK & ASSOCIATES LTD.

(57) ABSTRACT

Provided is a method of manufacturing a semiconductor device including a bump interconnect structure. In the method of manufacturing the semiconductor device, a first substrate including a connection pad is formed, and a bump including a solder layer and a metal post protruding from the solder layer are formed on the connection pad. A second substrate including a bump land may be formed. The first substrate may be disposed on the second substrate so that a protruding end of the metal post contacts the bump land, and the solder layer may be reflowed. Accordingly, it possible to interconnect the metal post to the bump land.

20 Claims, 23 Drawing Sheets

METHODS OF MANUFACTURING SEMICONDUCTOR DEVICE WITH BUMP INTERCONNECTION

CROSS-REFERENCE TO RELATED APPLICATIONS

The present application claims priority under 35 U.S.C 119(a) to Korean Applications No. 10-2021-0101168, filed on Aug. 2, 2021, which is incorporated herein by reference in its entirety.

BACKGROUND

1. Technical Field

The present disclosure relates to a semiconductor packaging technology, and more particularly, to a method of manufacturing a semiconductor device with bump interconnection.

2. Related Art

A semiconductor device may be configured in a form of a semiconductor package including a semiconductor die and a packaging substrate. The semiconductor device may have a structure in which a plurality of semiconductor dies are electrically connected to each other. Integrated circuits (ICs) may be integrated with a semiconductor die. The semiconductor die may be mounted on the packaging substrate. The semiconductor package may include an encapsulant that protects the semiconductor die. The semiconductor die and the packaging substrate may be electrically connected to each other through a bump interconnection. The bump interconnection may electrically connect the semiconductor die and another semiconductor die.

SUMMARY

An embodiment of the present disclosure may provide a method of manufacturing a semiconductor device including forming a first substrate including a connection pad, forming a bump on the connection pad, wherein the bump includes a solder layer and a metal post, and the metal post has a protruding end that protrudes from the solder layer, forming a second substrate including a bump land, disposing the first substrate over the second substrate such that the protruding end of the metal post contacts the bump land, and reflowing the solder layer to interconnect the metal post to the bump land.

Another embodiment of the present disclosure may provide a method of manufacturing a semiconductor device including forming a substrate including a connection pad, forming a first resist pattern on the connection pad of the substrate, the first resist pattern including a ring-shaped first opening, forming a ring pattern of a solder layer with an inserting hole by filling the ring-shaped first opening with a solder material, selectively removing a portion of the first resist pattern that fills the inserting hole, forming a second resist pattern with a second opening that substantially overlaps with the inserting hole, and filling the second opening with a metal material to form a metal post, the metal post with an inserting portion that is inserted into the inserting hole and a protruding portion that protrudes outside of the ring pattern of the solder layer.

DETAILED DESCRIPTION

Figure 1:
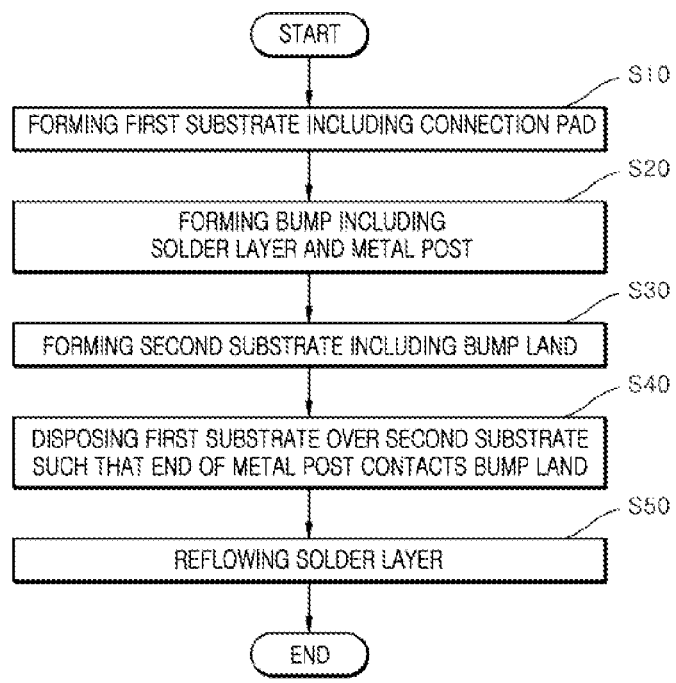
FIG. 1 is a process flowchart illustrating a method of manufacturing a semiconductor device according to an embodiment of the present disclosure.

The terms used in the description of the embodiments of the present disclosure are terms selected in consideration of functions in the presented embodiments, and the meaning of the terms may vary according to the intention or custom of users or operators in the technical field. The meanings of the terms used are in accordance with the defined definitions when specifically defined in the present disclosure, if there is no specific definition, it may be interpreted as the meaning generally recognized by those skilled in the art.

In the description of the embodiments of the present disclosure, descriptions such as "first," "second," "side," "top" and "bottom or lower" are to distinguish subsidiary materials, not used to limit the subsidiary materials themselves or to imply any particular order.

The semiconductor device may include a semiconductor substrate or a structure in which plurality of semiconductor substrates are stacked. The semiconductor device may indicate a semiconductor package structure in which a structure in which semiconductor substrates are stacked is packaged. Semiconductor substrates may refer to semiconductor wafers, semiconductor dies or semiconductor chips on which electronic components and elements are integrated. The semiconductor chip may refer to a memory chip in which a memory integrated circuit such as DRAM, SRAM, NAND FLASH, NOR FLASH, MRAM, ReRAM, FeRAM, or PcRAM is integrated, or a logic die in which a logic circuit is integrated on a semiconductor substrate or a processor such as an ASIC chip, an application processor (AP), a graphic processing unit (GPU), a central processing unit (CPU), or a system on a chip (SoC). The semiconductor device may be applied to information communication devices such as portable terminals, bio or health care related electronic devices, and wearable electronic devices. The semiconductor device may be applied to the Internet of Things.

The same reference numerals may refer to the same elements throughout the present disclosure. The same reference numerals or similar reference numerals may be described with reference to other drawings, even if they are not mentioned or described in the corresponding drawings. Further, even if a reference numeral is not indicated, it may be described with reference to other drawings.

FIG. 1 is a process flowchart diagram illustrating a method of manufacturing a semiconductor device according to an embodiment.

Referring to FIG. 1, the method of manufacturing the semiconductor device may include a step S10 of forming a first substrate including a connection pad, a step S20 of forming a bump including a solder layer and a metal post, a step of S30 forming a second substrate including bump lands, a step S40 of disposing the first substrate on the second substrate so that the protruding end of the metal post contacts the bump lands, and a step S50 of reflowing the solder layer.

Figure 2:
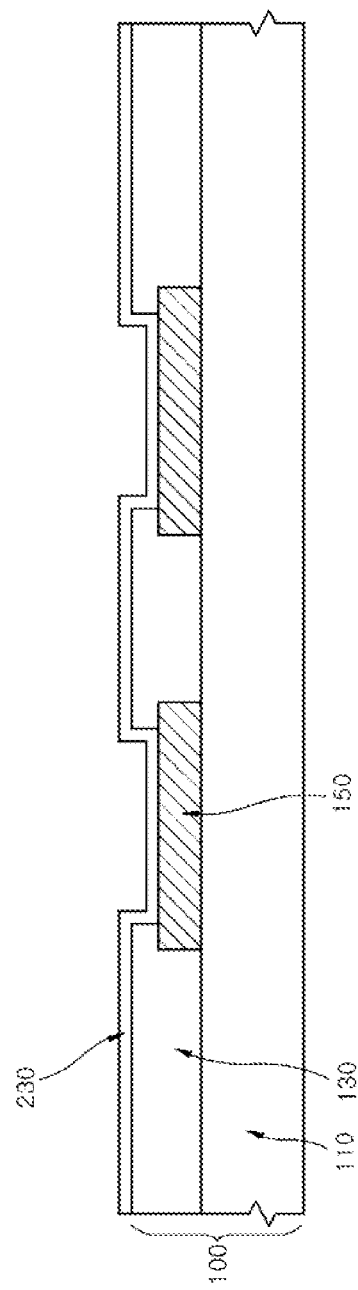
FIGS. 2 to 9 are schematic views illustrating a method of manufacturing the semiconductor device of FIG. 1.
Figure 3:
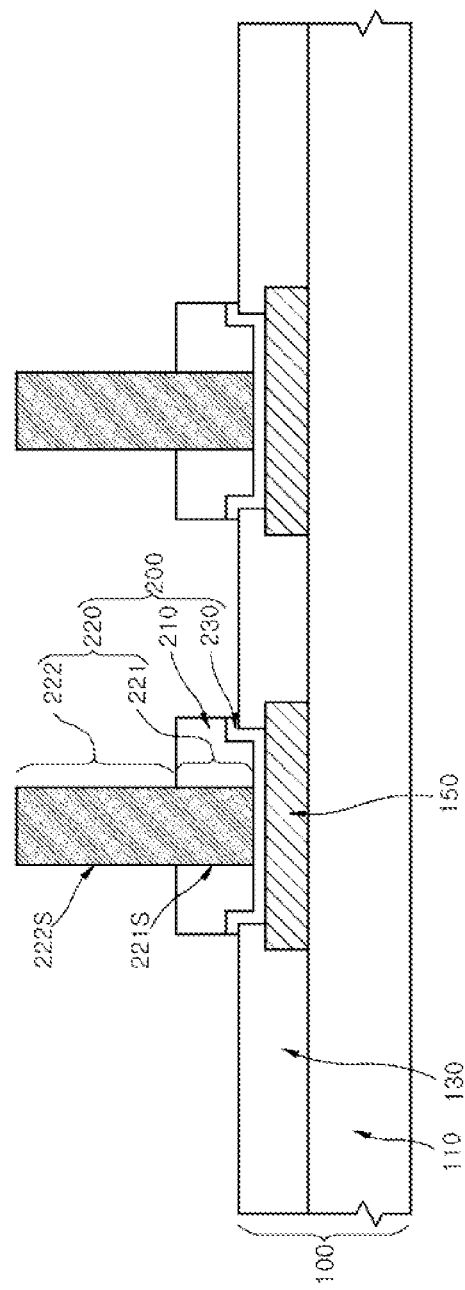
Figure 4:
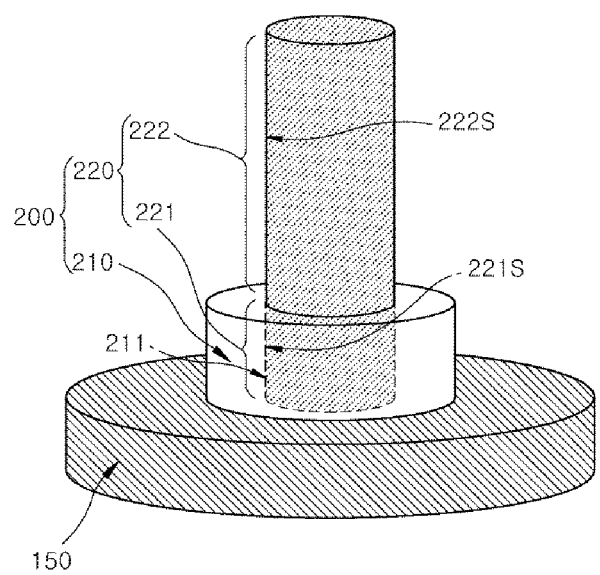
Figure 5:
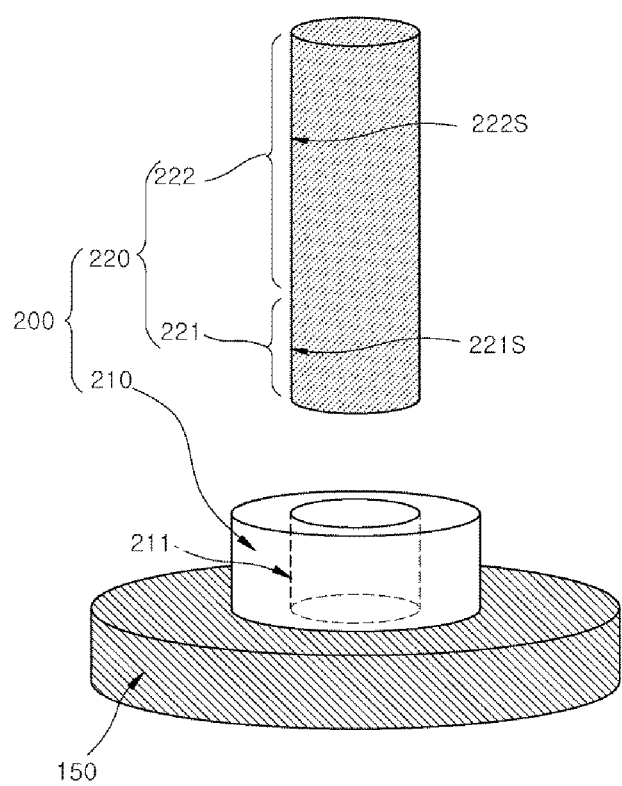

FIGS. 2 to 9 are schematic views illustrating a method of manufacturing the semiconductor device of FIG. 1. FIG. 2 is a schematic cross-sectional view illustrating the step S10 of forming the first substrate 100 of the method of manufacturing the semiconductor device of FIG. 1. FIG. 3 is a schematic cross-sectional view illustrating the step S20 of forming the bumps 200 on the first substrate 100 of the method of manufacturing the semiconductor device of FIG. 1. FIGS. 4 and 5 are schematic views illustrating the enlarged bumps 200 of FIG. 3.

Referring to FIG. 2 together with FIG. 1, the method of manufacturing the semiconductor device 10 may include the step S10 of forming the first substrate 100 including connection pads 150. The semiconductor device 10 may include the first substrate 100. The first substrate 100 may include a first body of substrate 110 and the connection pads 150. The first substrate 100 may further include a dielectric layer 130. The connection pads 150 may be formed on the first body of substrate 110, and the dielectric layer 130 that exposes a portion of each of the connection pads 150 may be formed on the first body of substrate 110. A seed metal layer 230 that extends onto the first substrate 100 may be formed on the connection pads 150. The seed metal layer 230 may extend to cover the dielectric layer 130. The seed metal layer 230 may be formed as a plating seed layer in a plating process of forming bumps on the connection pads 150.

The first substrate 100 may include a semiconductor die. The semiconductor die may refer to a semiconductor chip. The semiconductor die may include integrated circuits (ICs). A memory device, such as a DRAM device or a NAND device, may be integrated in the semiconductor die. The first body of substrate 110 may include a semiconductor material layer, such as silicon (Si). The first body of substrate 110 may further include a multi-level metallization layer that is formed on the semiconductor material layer. The multi-level metallization layer may include a plurality of insulation layers and a plurality of conductive patterns.

The connection pads 150 may be formed as connection terminals that electrically connect the integrated circuits integrated on the first substrate 100 to an external device. The connection pads 150 may include conductive patterns including copper (Cu) or aluminum (Al). The dielectric layer 130 may be formed on the first body of substrate 110 while exposing a portion of each of the connection pads 150. The dielectric layer 130 may include a passivation layer that protects the first substrate 100 or the first body of substrate 110. The dielectric layer 130 may include a dielectric material, such as silicon oxide ($SiO_2$) or silicon nitride ($Si_3N_4$).

Referring to FIG. 3 together with FIG. 1, the method of manufacturing the semiconductor device 10 may include a step S20 of forming the bumps 200 on the connection pads 150. The bumps 200 may be formed as elements that are electrically connected and coupled to the connection pads 150. Each of the bumps 200 may include a solder layer 210 and a metal post 220. Each of the bumps 200 may further include the seed metal layer 230. The seed metal layer 230 may be formed between the connection pad 150 and the solder layer 210. The seed metal layer 230 may be formed between the connection pad 150 and the metal post 220. The seed metal layer 230 may be formed as a plating seed layer in a plating process that forms the solder layers 210. The seed metal layer 230 may be used as a plating seed layer in another plating process of forming the metal posts 220. The seed metal layer 230 may be formed as a single layer, constituting an under bump metallurgy layer (UBM) for the solder layers 210 and the metal posts 220. The under bump metallurgy layer may include a structure in which several types of metal layers are stacked in multiple layers.

Each of the solder layers 210 may be formed as a conductive adhesive layer that bonds or couples the metal post 220 to another connecting component or connector that corresponds to the metal post 220. The solder layer 210 may include various soldering materials. The solder layer 210 may include tin (Sn), a tin-silver (SnAg) alloy, or a tin-silver-gold (AuSnAg) alloy.

The metal posts 220 may be formed to be coupled or bonded to the connection pads 150 while penetrating the solder layers 210. The seed metal layer 230 may be further interposed between the metal post 220 and the connection pad 150. Each of the metal posts 220 may be formed such that a portion of the metal posts 220 protrudes out from the solder layer 210. The metal post 220 may include a metal material with a higher stiffness than a solder material that forms the solder layer 210. The metal post 220 may be formed of a metal material with a higher melting point than the solder material. The metal post 220 may include copper (Cu). The metal post 220 may refer to a conductive bump or a conductive pillar.

Referring to FIG. 4 together with FIG. 3, the metal post 220, constituting the bump 200, may include an inserting portion 221 and a protruding portion 222. The inserting portion 221 of the metal post 220 may be a portion that penetrates the solder layer 210, and the protruding portion 222 of the metal post 220 may be a portion that extends from the inserting portion 221 and protrudes from the solder layer 210. The inserting portion 221 of the metal post 220 may include a portion that is connected to the connection pad 150, penetrating the solder layer 210 and inserted into the solder layer 210. A side surface 221S of the inserting portion 221 of the metal post 220 may be a side portion that is covered by the solder layer 210. A side surface 222S of the protruding portion 222 of the metal post 220 may be a side portion that is exposed because the solder layer 210 cannot cover the protruding portion 222 of the metal post 220.

FIG. 5 is an exploded view illustrating the metal post 220 and the solder layer 210 substantially constituting the bump 200 illustrated in FIG. 4. The solder layer 210 may include a structure in which an inserting hole 211 is formed in a form of a hole that penetrates through the center of the body. The solder layer 210 may be formed on the connection pad 150 in a ring pattern with the inserting hole 211. The metal post 220 may be formed in a shape in which the inserting portion 221 of the metal post 220 is inserted into the inserting hole 211 of the ring pattern of the solder layer 210. The metal post 220 may be formed such that the protruding portion 222 extends from the inserting portion 221 and protrudes outside of the ring pattern shape of the solder layer 210.

Although the solder layer 210 is illustrated in a circular ring pattern in FIGS. 4 and 5, the solder layer 210 may be formed in a ring pattern of various shapes, such as a rectangular ring pattern or a polygonal ring pattern. Although the metal post 220 is illustrated in a circular column shape in FIGS. 4 and 5, the metal post 220 may be formed in various column shapes, such as a square column shape or a polygonal column shape.

Figure 6:
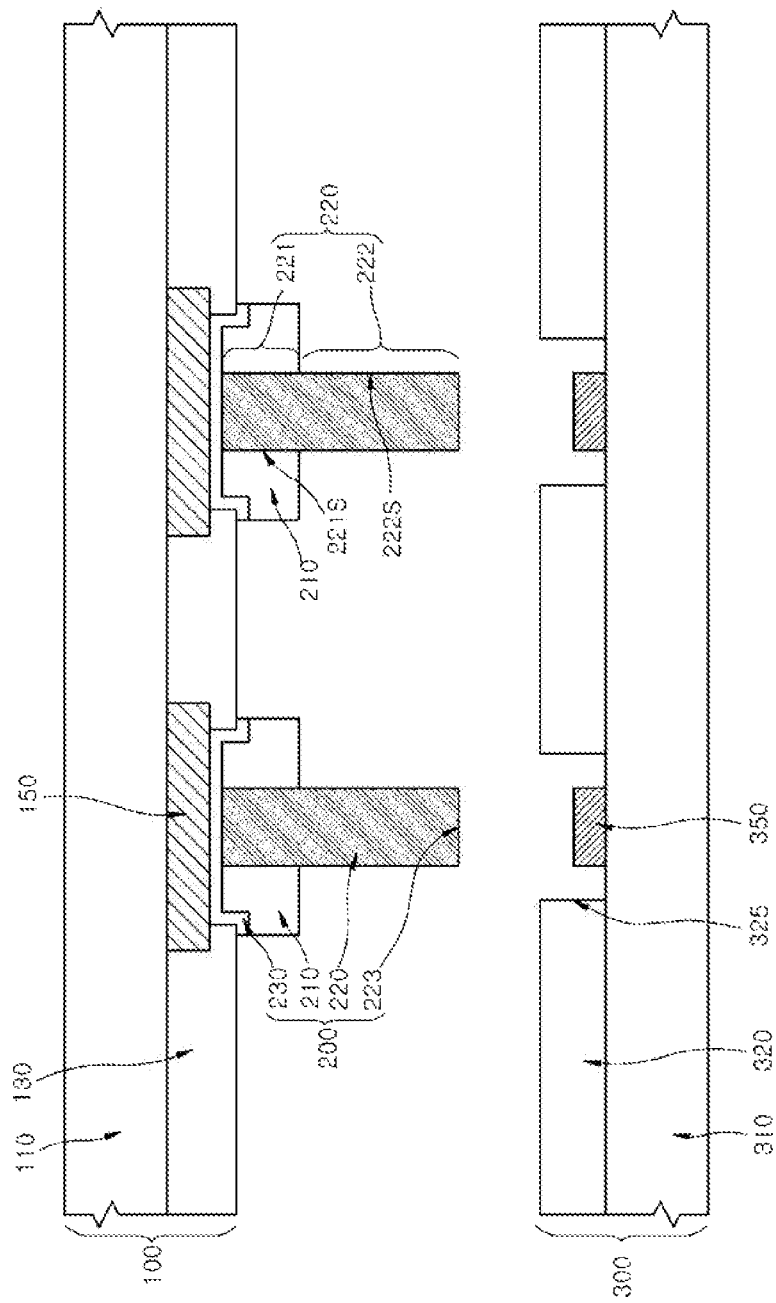

FIG. 6 is a schematic cross-sectional view illustrating the step S30 of forming the second substrate 300 of the method of manufacturing the semiconductor device of FIG. 1. FIG. 6 further illustrates the introduction of the flipped first substrate 100 on the second substrate 300.

Referring to FIG. 6 together with FIG. 1, the method of manufacturing the semiconductor device 10 may include the step S30 of forming the second substrate 300 including bump lands 350. The second substrate 300 may include a packaging substrate on which a semiconductor die including the first substrate 100 is to be mounted. The second substrate 300 may be configured to electrically connect the semiconductor die including the first substrate 100 to an external device, an external module, or other electronic components. The second substrate 300 may be configured in the form of a printed circuit board (PCB). The second substrate 300 may refer to an interposer type or a multilayer structure including a redistribution layer (RDL).

The second substrate 300 may include a second body of substrate 310 and the bump lands 350. The second substrate 300 may further include solder resist patterns 320 that are disposed on the second body of substrate 310. The second body of substrate 310 may include a dielectric layer. Although not specifically illustrated, the second body of substrate 310 may include a plurality of dielectric layers, a plurality of conductive trace patterns, and a plurality of conductive vias. The conductive vias may connect the conductive trace patterns that are disposed on different layers to each other. The bump lands 350 may include an element to which the bumps 200 are landed and connected over the second body of substrate 310. Although not illustrated, conductive trace patterns that are connected to the bump lands 350 may be further formed on the second body of substrate 310. Each of the bump lands 350 may be formed as a conductive pattern including copper (Cu).

The solder resist patterns 320 may be formed on the second body of substrate 310. The solder resist pattern 320 may be formed to provide third openings 325 that expose the bump lands 350. A sidewall of the third opening 325 may be spaced apart from the bump land 350 to induce a concave groove structure between the sidewall of the third opening 325 and the bump land 350. The second substrate 300 may include another semiconductor die that corresponds to the semiconductor die configuring the first substrate 100. The second body of substrate 310 may include a semiconductor material layer, and the bump lands 350 may be configured as other connection pads.

Referring again to FIG. 6, in order to couple the first substrate 100 to the second substrate 300, the first substrate 100 may be introduced onto the second substrate 300. The first substrate 100 of FIG. 3 may be flipped and positioned over the second substrate 300, as illustrated in FIG. 6. The first substrate 100 may be introduced over the second substrate 300 such that the ends 223 of the bumps 200 face the bump lands 350. The first substrate 100 may be introduced over the second substrate 300 such that the ends 223 of the bumps 200 are aligned with the bump lands 350.

Figure 7:
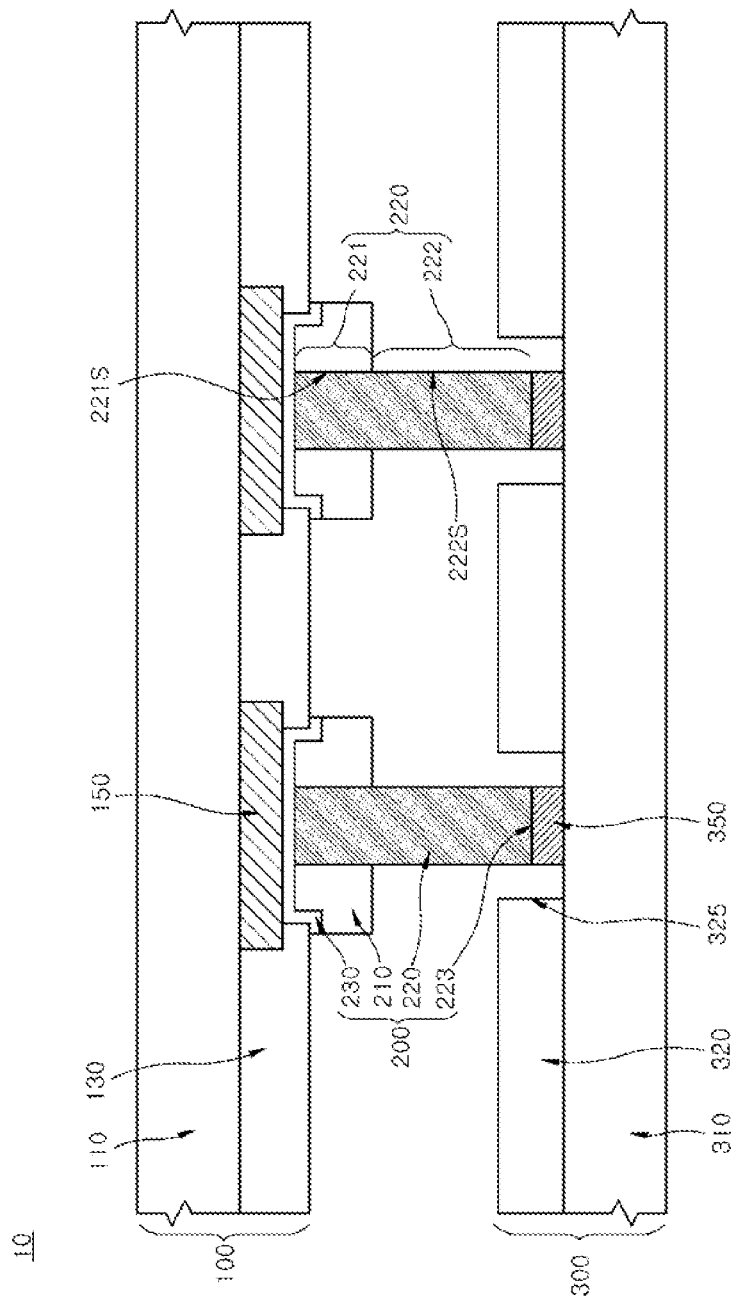

FIG. 7 is a schematic cross-sectional view illustrating a step S40 of disposing the first substrate 100 on the second substrate 300 of the method of manufacturing the semiconductor device of FIG. 1.

Referring to FIG. 7 together with FIG. 1, the method of manufacturing the semiconductor device 10 may include the step S40 of disposing the first substrate 100 on the second substrate 300. As illustrated in FIG. 6, after the first substrate 100 is flipped and introduced over the second substrate 300, the first substrate 100 may be disposed on the second substrate 300 by lowering the first substrate 100 toward the second substrate 300 so that the ends 223 of the bumps 200 of the first substrate 100 contacts the bump lands 350 of the second substrate 300.

Figure 8:
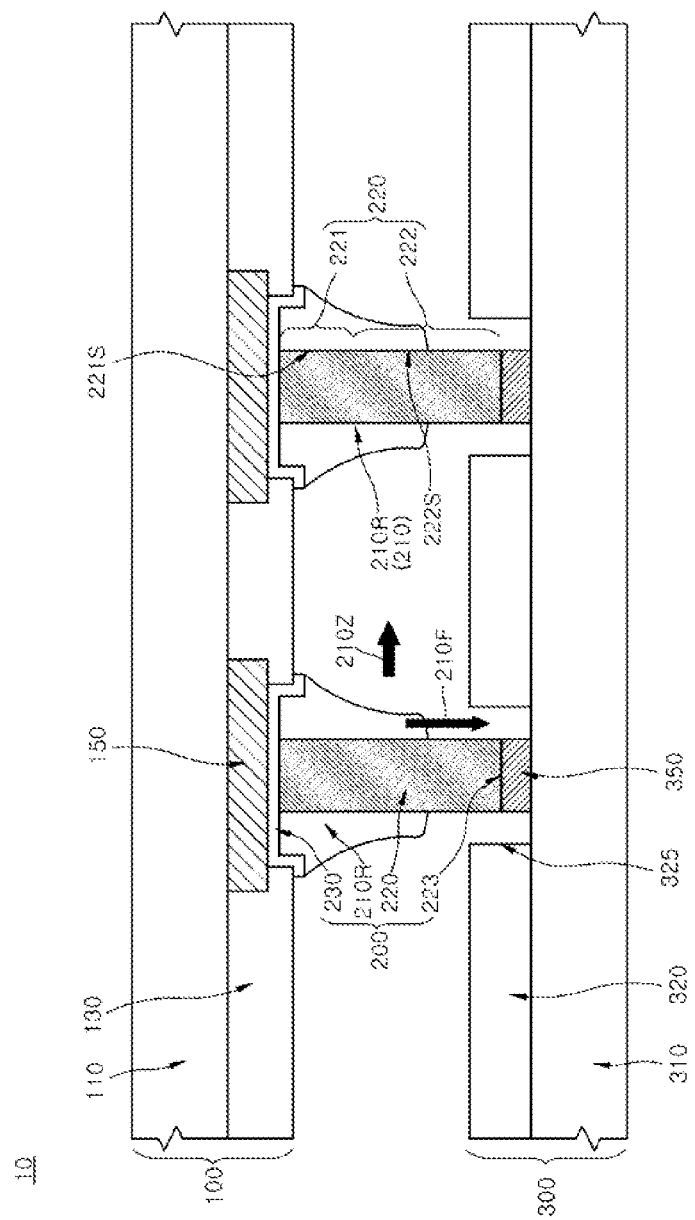
Figure 9:
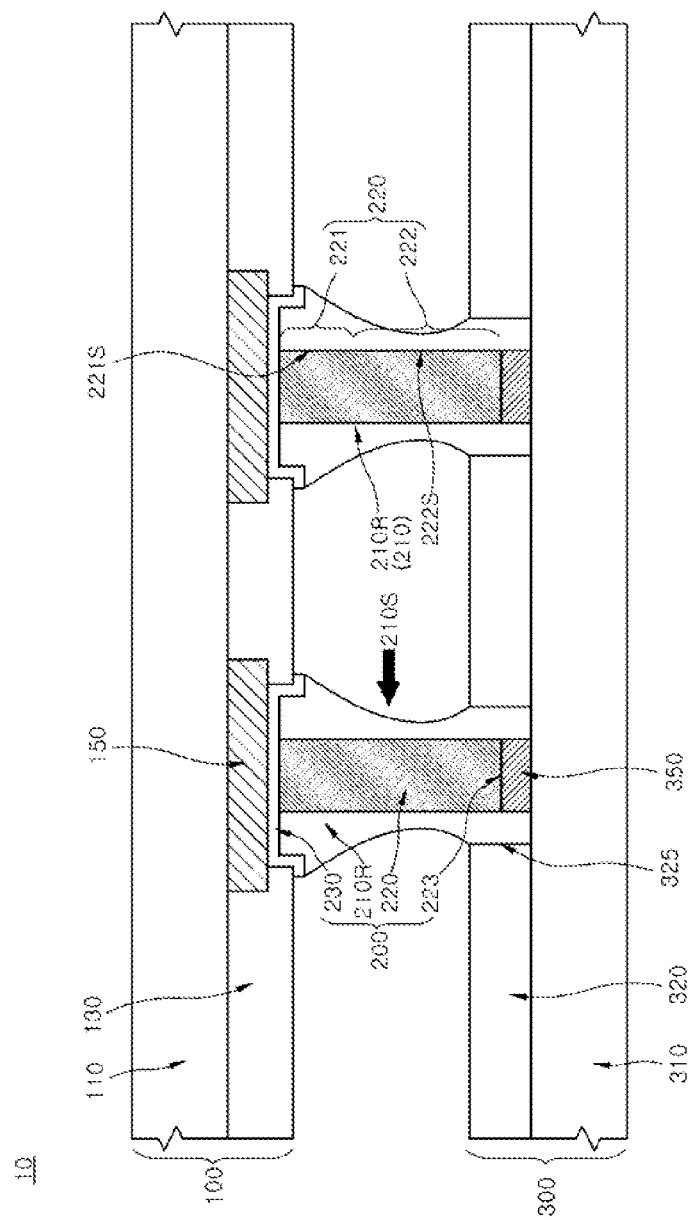

FIGS. 8 and 9 are schematic cross-sectional views illustrating the step S50 of reflowing solder layers 210R of the method of manufacturing the semiconductor device of FIG. 1. FIG. 8 illustrates that reflow of the solder layers 210R is in progress, and FIG. 9 illustrates that the reflowed solder layers 210R are bonded to the bump lands 350.

Referring to FIGS. 8 and 9, together with FIG. 1, the method of manufacturing the semiconductor device 10 may include the step S50 of reflowing the solder layers 210R. Referring to FIG. 8, in a state in which the end 223 of each of the bumps 200 of the first substrate 100 contacts each of the bump lands 350 of the second substrate 300, a thermal budget may be applied to the solder layers 210R to reflow the solder layers 210R. The solder material configuring the solder layers 210R may be melted based on the amount of applied heat, and the molten solder material may flow down. The molten solder layers 210R may flow down to sequentially cover the side surfaces 222S of the protruding portions 222 of the metal posts 220 from top to bottom.

The solder layers 210R may flow down while covering the side surfaces 222S of the protruding portions 222 of the metal posts 220 so that the flowed solder layers 210R may contact the bump lands 350, as illustrated in FIG. 9. The flowed solder layers 210R may cover the bump lands 350, and accordingly, may be bonded to the bump lands 350. As the reflowed solder layers 210R cover the side surfaces 221S and 222S of the metal posts 220 and are bonded to the bump lands 350, the metal posts 220 may be interconnected to the bump lands 350 through the reflowed solder layers 210R.

The side surface 210S of each of the reflowed solder layers 210R may be formed in the shape of a depression side that is curved around the metal post 220. Because the side surface 210S of the reflowed solder layer 210R has a depression side 210S, a bridge fail in which the solder layer 210R is connected to another adjacent bump 200 may be substantially suppressed or reduced. Accordingly, the risk of an electrical short in which the bump 200 and other adjacent bumps 200 are electrically connected may be reduced.

Figure 10:
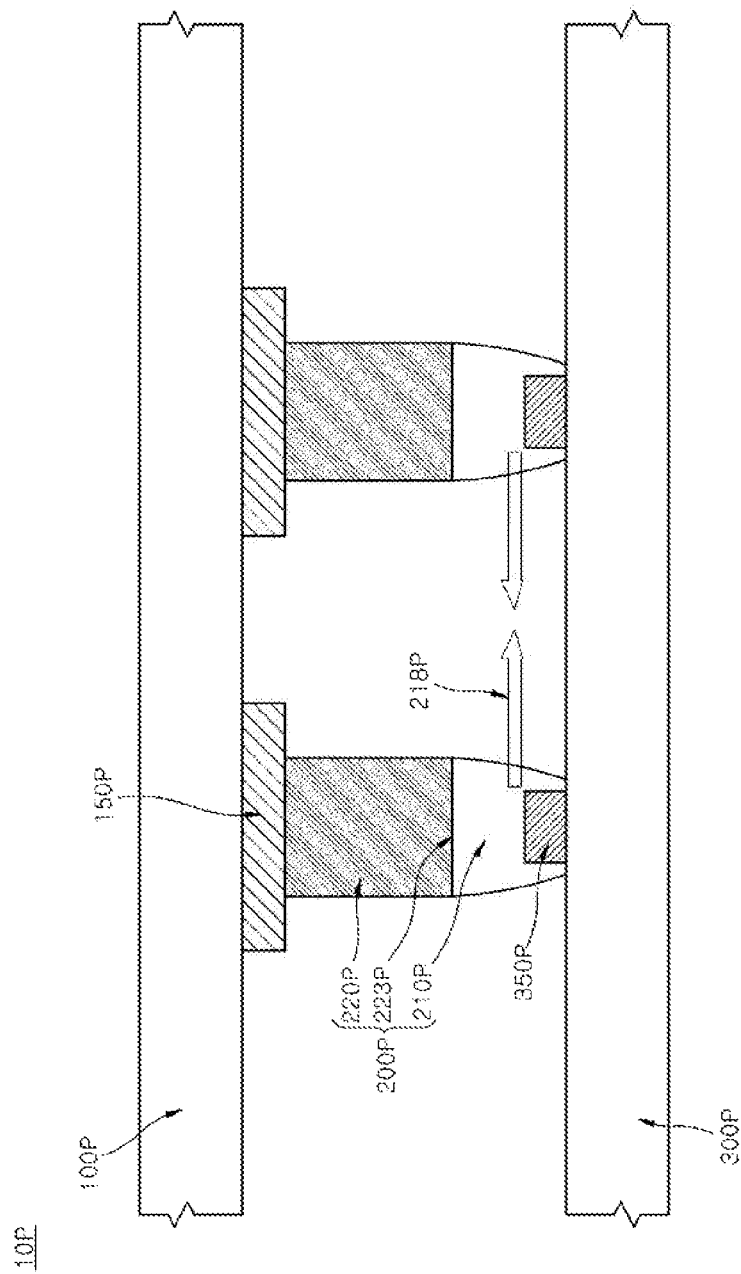
FIGS. 10 and 11 are schematic cross-sectional views illustrating bump interconnections of a semiconductor device according to a comparative example.
Figure 11:
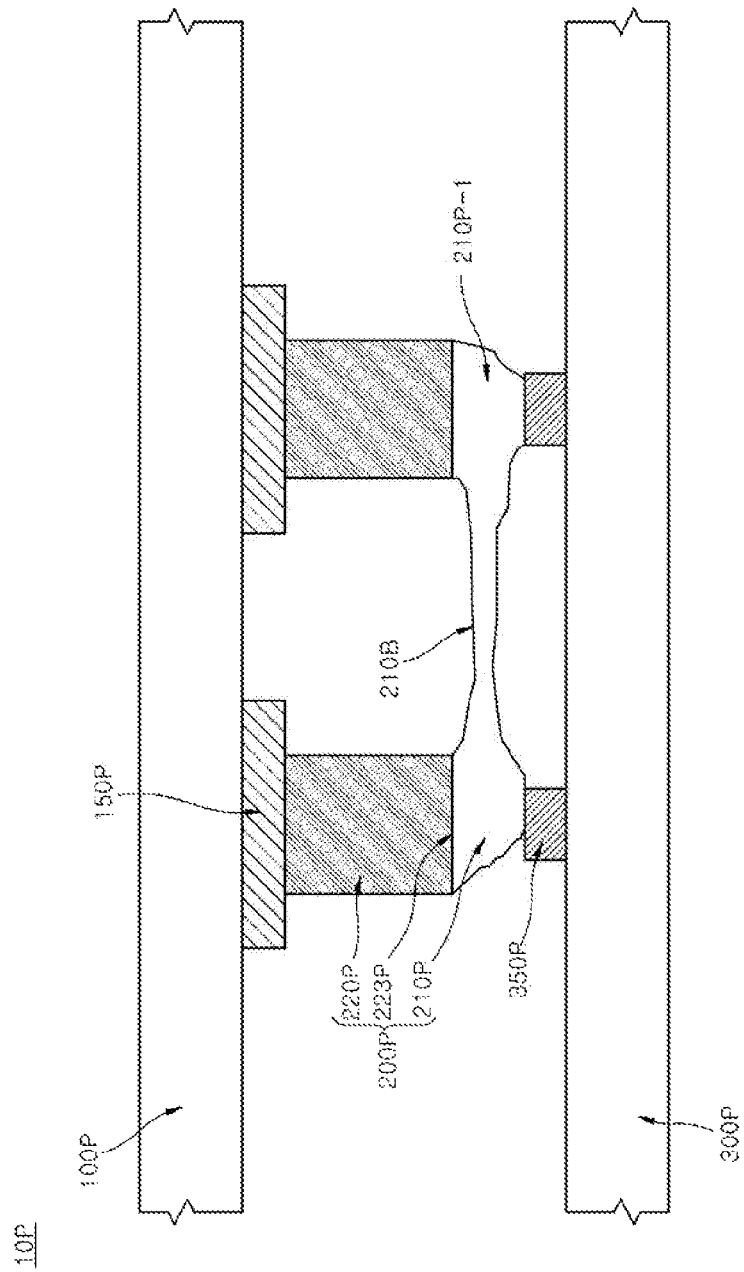

FIGS. 10 and 11 are schematic cross-sectional views illustrating a bump interconnect structure of a semiconductor device 10P according to a comparative embodiment.

Referring to FIG. 10, the semiconductor device 10P, according to the comparative embodiment, may include a structure in which a first substrate 100P and a second substrate 300P are coupled by a bump interconnect structure. The first substrate 100P may include connection pads 150P and bumps 200P, and the second substrate 300P may include bump lands 350P. Each of the bumps 200P may include a metal post 220P and a solder layer 210P. The metal post 220P may be bonded to the connection pad 150P and may have a shape that protrudes from the connection pad 150P. The solder layer 210P, before reflow, may be formed to cover an end 223P of the metal post 220P. The solder layer 210P, before reflow, may be positioned between the end 223P of the metal post 220P and the bump land 350P. Because the solder layer 210P is located on the end 223P of the metal post 220P, there is a possibility that the solder layer 210P may undesirably flow in a lateral direction 218P as the solder layer 210P reflows. Accordingly, as illustrated in FIG. 11, a bridge failure 210B in which the solder layer 210P and another neighboring solder layer 210P-1 are connected to each other may be caused.

Referring again to FIG. 7, the solder layer 210, according to the embodiment of the present disclosure, may be formed to cover the side surface 221S of the inserting portion 221 of the metal post 220 and to expose the side surface 222S of the protruding portion 222 of the metal post 220. Accordingly, the solder layer 210 might not be positioned between the end 223 of the metal post 220 and the bump land 350, but may be positioned as far apart as the length of the protruding portion 222 of the metal post 220 from the bump land 350.

When the solder layer 210R reflows, as illustrated in FIG. 8, the solder layer 210R may flow down while covering the side surface 222S of the protruding portion 222 of the metal post 220. Because the solder layer 210R is located away from the end 223 of the metal post 220 and close to the connection pad 150, the downward flow 210F of the solder layer 210R may be induced to prevail over the lateral flow 210Z of the solder layer 210R. Accordingly, as the lateral flow 210Z of the solder layer 210R is restricted, the solder layer 210R may reflow. As such, it is possible to reflow the solder layer 210R while restricting or reducing the lateral flow 210Z of the solder layer 210R. Accordingly, it is possible to suppress, eliminate, or reduce the bridge fail 210B shown in FIG. 11.

Figure 12:
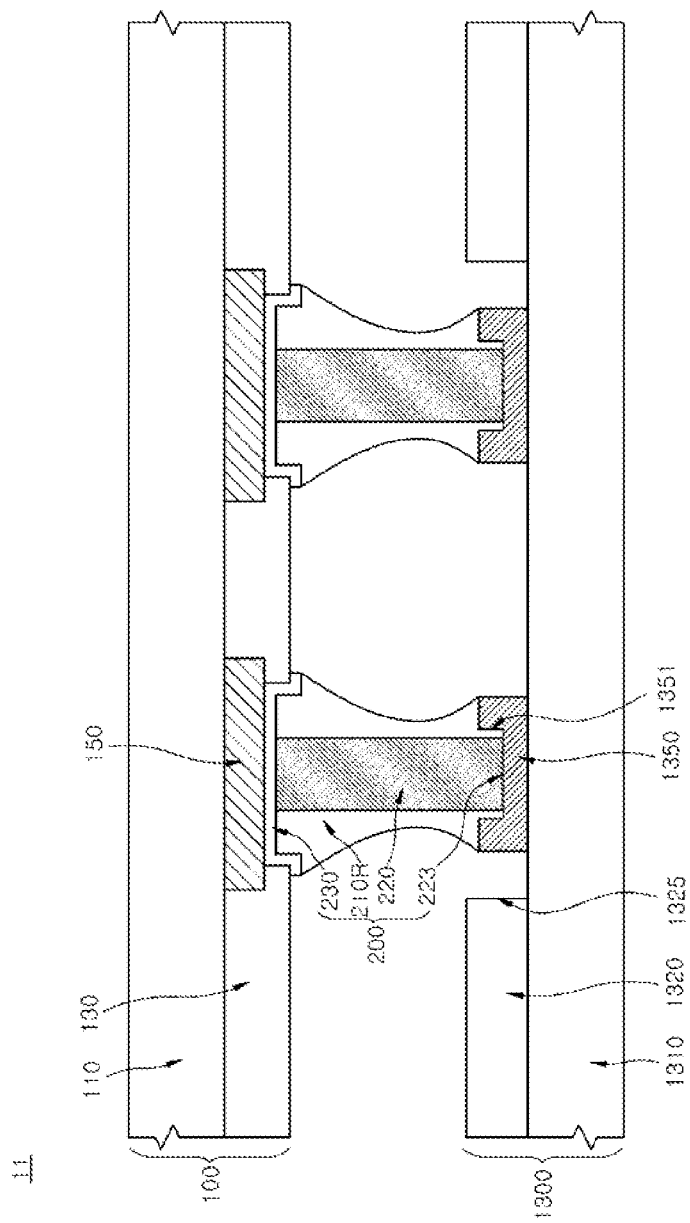
FIG. 12 is a schematic cross-sectional view illustrating a semiconductor device according to another embodiment of the present disclosure.

FIG. 12 is a schematic cross-sectional view illustrating a semiconductor device 11 according to another embodiment of the present disclosure. In FIG. 12, the same reference numerals as those illustrated in FIGS. 2 to 9 may indicate substantially the same components.

Referring to FIG. 12, the semiconductor device 11, according to another embodiment of the present disclosure, may include a first substrate 100 and a second substrate 1300. The second substrate 1300 may include a second body of substrate 1310 and bump lands 1350. The second substrate 1300 may further include solder resist patterns 1320. The solder resist patterns 1320 may be patterns that provide a fourth opening 1325. The plurality of bump lands 1350 may be disposed in the fourth opening 1325. Each of the bump lands 1350 may include a concave groove 1351 in its surface. An end 223 of each of the metal posts 220 may be inserted into the concave groove 1351. The first substrate 100 may be disposed over the second substrate 1300 so that the ends 223 of the metal posts 220 are inserted into the concave groove 1351. Accordingly, the accuracy in which the first substrate 100 is aligned with the second substrate 1300 may be improved.

As the solder layers 210R reflow to cover the bump lands 1350, the reflowed solder material may flow into the concave grooves 1351 of the bump lands 1350. A portion of each of the solder layers 210R may fill the concave groove 1351 of each of the bump lands 1350 so that an overflow of the solder layers 210R out of the bump lands 1350 may be limited or reduced. Accordingly, the bridge fail 210B illustrated in FIG. 11 may be suppressed, excluded, or reduced.

Figure 13:
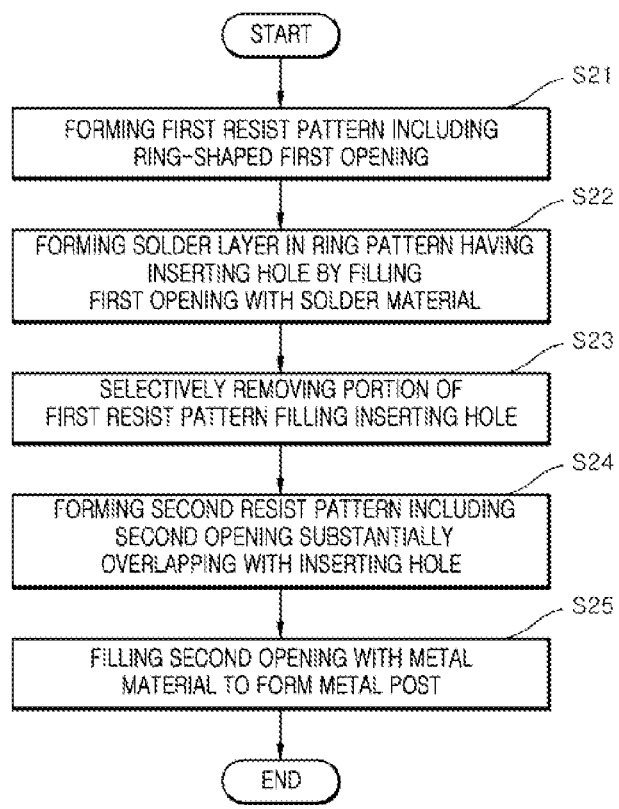
FIG. 13 is a detailed process flowchart illustrating a step of forming bumps in a method of manufacturing the semiconductor device of FIG. 1.

FIG. 13 is a detailed process flowchart illustrating the step S20 of forming the bumps in the method of manufacturing the semiconductor device of FIG. 1.

Referring to FIG. 13, the step S20 of forming the bumps in the method of manufacturing the semiconductor device of FIG. 1 may include a step S21 of forming a first resist pattern including a ring-shaped first opening, a step S22 of forming a solder layer in a ring pattern with an inserting hole by filling a solder material in the first opening, a step S23 of selectively removing the portion that fills the inserting hole of the first resist pattern, a step S24 of forming a second resist pattern including a second opening substantially overlapping the inserting hole, and a step S25 of filling the second opening with a metal material to form a metal post.

Figure 14:
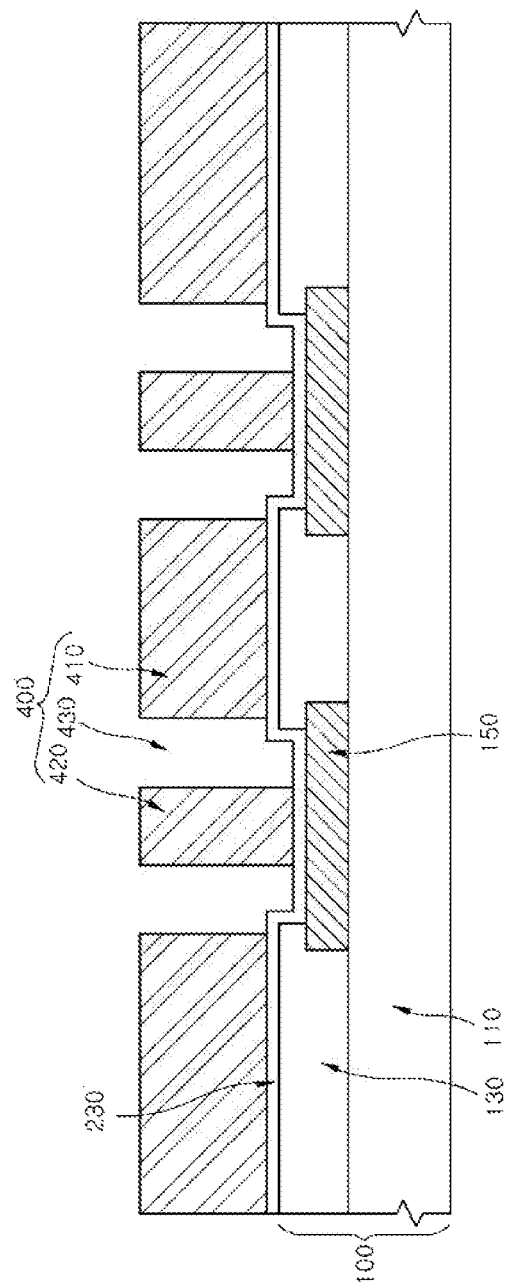
FIGS. 14 to 22 are schematic cross-sectional views illustrating detailed process steps of forming bumps in the method of manufacturing the semiconductor device of FIG. 13.
Figure 15:
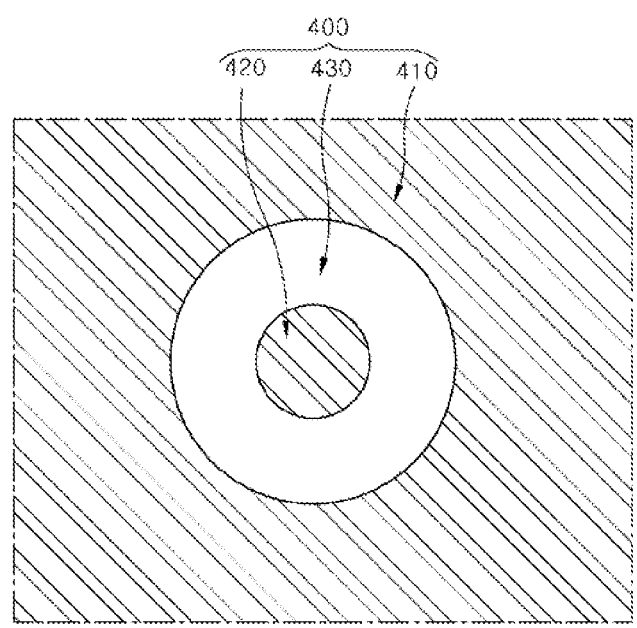

FIGS. 14 to 22 are schematic cross-sectional views illustrating detailed process steps of the step S20 of forming the bumps in the method of manufacturing the semiconductor device of FIG. 13. In FIGS. 14 to 22, the same reference numerals as those illustrated in FIGS. 2 to 9 may indicate substantially the same components. FIG. 14 is a schematic cross-sectional view illustrating the step S21 of forming a first resist pattern 400 of the step S20 of forming the bumps in the method of manufacturing the semiconductor device of FIG. 13. FIG. 15 is a schematic plan view illustrating a planar shape of the first resist pattern 400 of FIG. 14.

Referring to FIG. 14, the first resist pattern 400 may be formed on connection pads 150 of a first substrate 100. A seed metal layer 230 may be formed on the connection pads 150, and the first resist pattern 400 may be formed on the seed metal layer 230. The first resist pattern 400 may be formed in a pattern including a first opening 430.

Referring to FIG. 15, the first opening 430 may be formed in a shape of an opening that provides a pattern shape of the solder layer 210, illustrated in FIG. 5. In order to form the solder layer 210 in a ring pattern, the first opening 430 may be formed in a ring shape. The first resist pattern 400 may include a first portion 410 and a second portion 420. The first portion 410 of the first resist pattern 400 may be a pattern portion that provides an outline shape of the first opening 430. The second portion 420 of the first resist pattern 400 may be a pattern portion that is formed in a columnar shape at the center of the first opening 430 so that the first opening 430 has a ring shape. The first portion 410 and the second portion 420 of the first resist pattern 400 may be formed in pattern portions that are spaced apart from each other.

Figure 16:
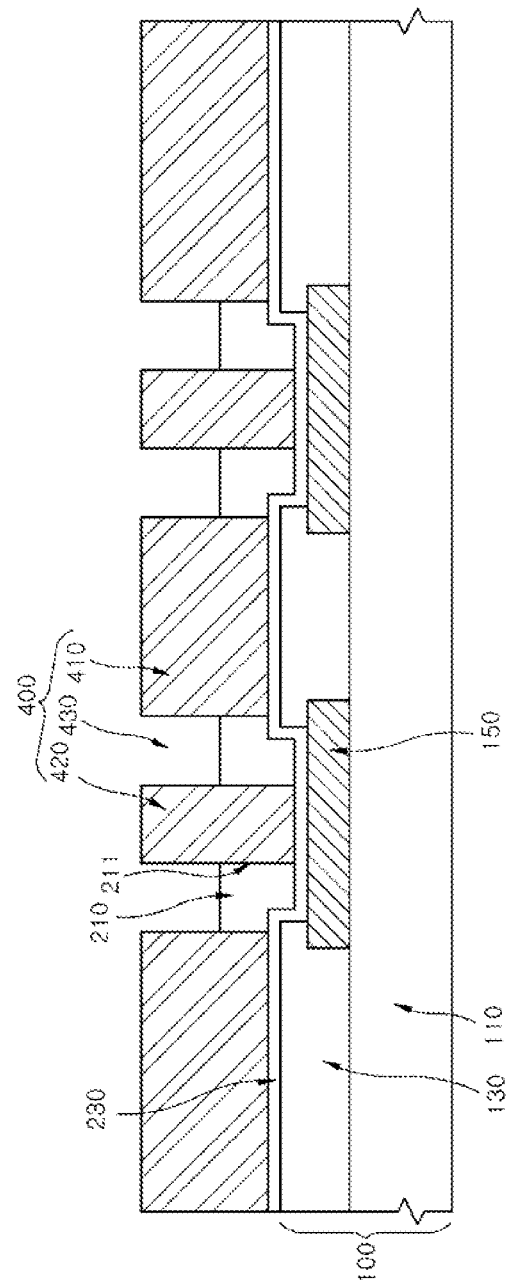

FIG. 16 is a schematic cross-sectional view illustrating the step S22 of forming the solder layer of the step S20 of forming the bumps in the method of manufacturing the semiconductor device of FIG. 13.

Referring to FIG. 16, a first plating process of plating the solder material may be performed. By using the seed metal layer 230 as a plating seed layer, a solder material may be plated and grown from the seed metal layer 230. The first resist pattern 400 may be formed in a plating resist layer that guides plating of the solder material during the process of plating the solder material. From the portion of the seed metal layer 230 that is exposed by the first opening 430 of the first resist pattern 400, the solder material may be plated and grown to fill the first opening 430. The solder material may fill the first opening 430 to form a solder layer 210 with a pattern shape that conforms to the shape of the first opening 430 in the first opening 430. The solder layer 210 may be formed in a ring pattern with an inserting hole (211 in FIG. 5). The solder material may be plated to partially fill the first opening 430. Alternatively, the solder material may be plated to substantially completely fill the first opening 430.

Figure 17:
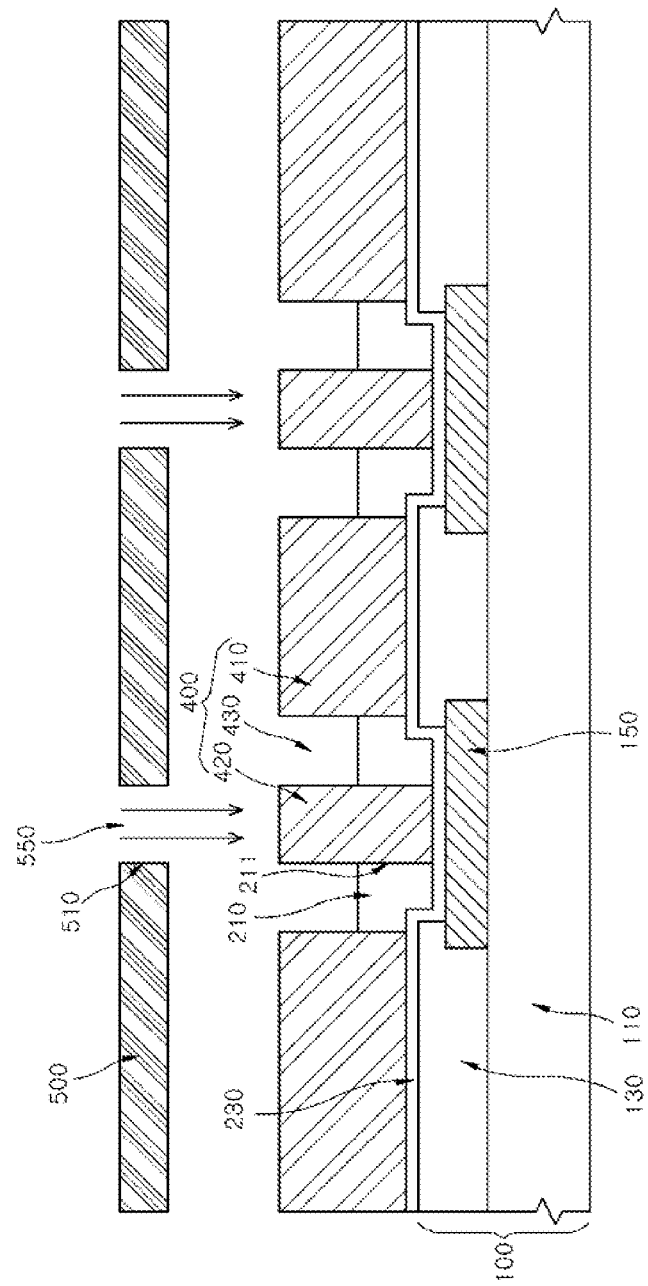
Figure 18:
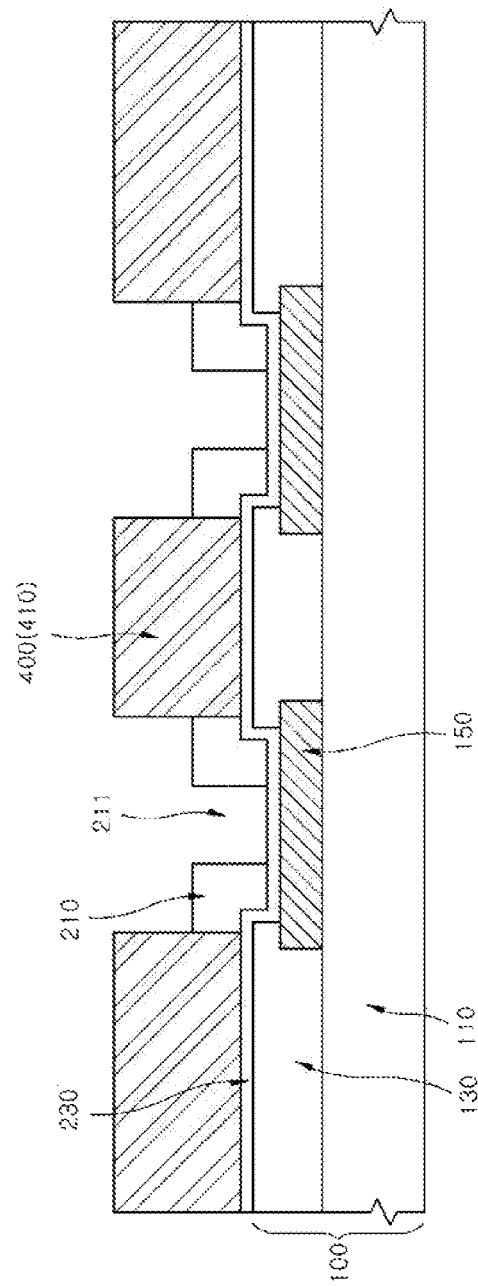

FIGS. 17 and 18 are schematic views illustrating the step S23 of selectively removing the second portion 420 of the first resist pattern 400 of the step S20 of forming the bumps in the method of manufacturing the semiconductor device of FIG. 13. FIG. 17 is a schematic diagram illustrating a step of exposing the second portion 420 of the first resist pattern 400. FIG. 18 is a schematic cross-sectional view illustrating a step of developing the exposed second portion 420 of the first resist pattern 400.

Referring to FIG. 17, the second portion 420 of the first resist pattern 400 may be selectively exposed. The second portion 420 of the first resist pattern 400 may be a portion that fills the inserting hole 211 of the solder layer 210. In order to expose the inserting hole 211 of the solder layer 210, it is required to remove the second portion 420 of the first resist pattern 400 that fills the inserting hole 211 of the solder layer 210. In order to remove the second portion 420 of the first resist pattern 400, an exposure light 550 that is exposed to the second portion 420 of the first resist pattern 400 that fills the inserting hole 211 may be irradiated. In order to selectively irradiate the exposure light 550 that is exposed to the second portion 420 of the first resist pattern 400, a reticle or an exposure mask 500 may be introduced over the first resist pattern 400. The exposure mask 500 may have an aperture 510 in a portion that overlaps with the second portion 420 of the first resist pattern 400. The exposure light 550 may pass through the aperture 510 and reach the second portion 420 of the first resist pattern 400. A body portion of the exposure mask 500, other than the aperture 510, may block the exposure light 550.

The second portion 420 of the first resist pattern 400 may be exposed to the exposure light 550. The exposed second portion 420 of the first resist pattern 400 may be developed, as illustrated in FIG. 18. By a developing process using a developer, the second portion 420 of the first resist pattern 400 may be selectively removed. Accordingly, the inserting hole 211 of the solder layer 210 may be exposed, and a portion of the seed metal layer 230 may be exposed at the bottom of the inserting hole 211. As described above, the second portion 420 that fills the inserting hole 211 of the first resist pattern 400 may be selectively removed through the exposure and development process (S23 of FIG. 13).

Figure 19:
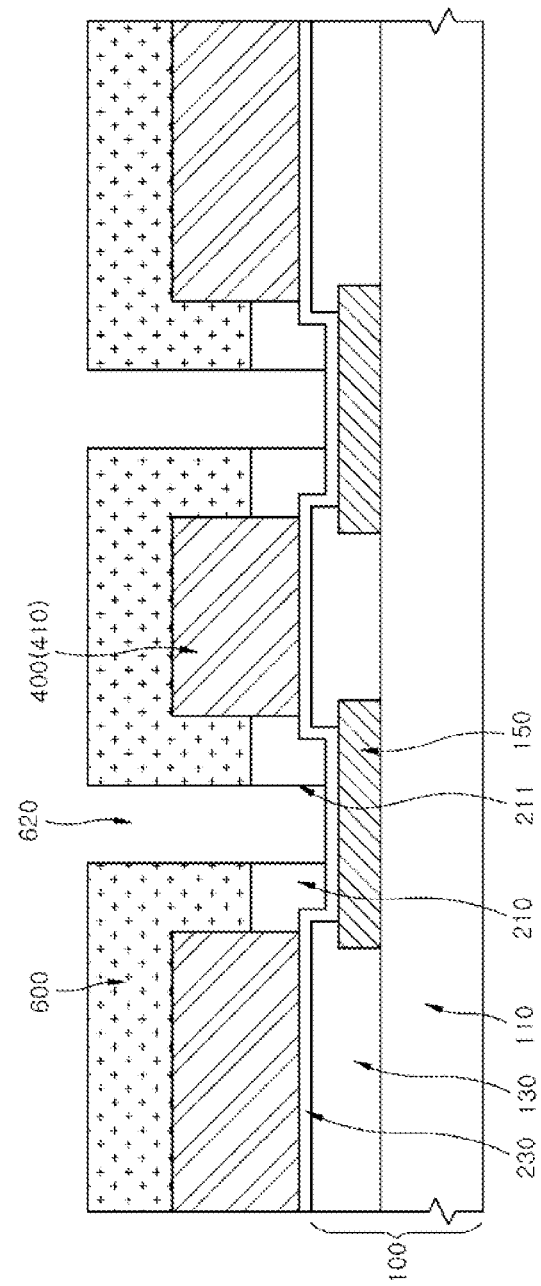
Figure 20:
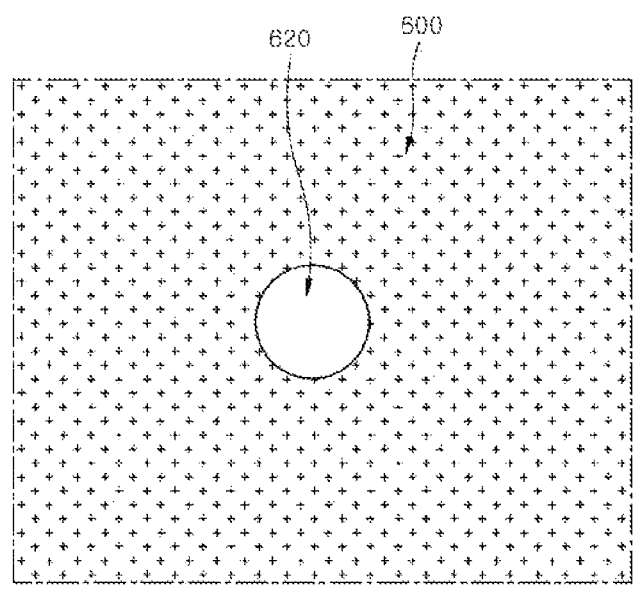

FIG. 19 is a schematic cross-sectional view illustrating the step S24 of forming the second resist pattern 600 of the step S20 of forming the bumps in the method of manufacturing the semiconductor device of FIG. 13. FIG. 20 is a schematic plan view illustrating a planar shape of the second resist pattern 600 of FIG. 19.

Referring to FIG. 19, the second resist pattern 600 may be formed on the first resist pattern 400. The second resist pattern 600 may be formed to cover the first portion 410 of the first resist pattern 400 and cover a portion of the solder layer 210. The second resist pattern 600 may be formed to expose the inserting hole 211 of the solder layer 210. The second resist pattern 600 may be formed in a pattern including a second opening 620 that exposes the inserting hole 211 of the solder layer 210, as illustrated in FIG. 20. The second resist pattern 600 may be formed such that the second opening 620 of the second resist pattern 600 substantially overlaps with the inserting hole 211 of the solder layer 210. The second resist pattern 600 may be formed in a pattern that exposes a portion of the seed metal layer 230 that is located at the bottom of the inserting hole 221.

Figure 21:
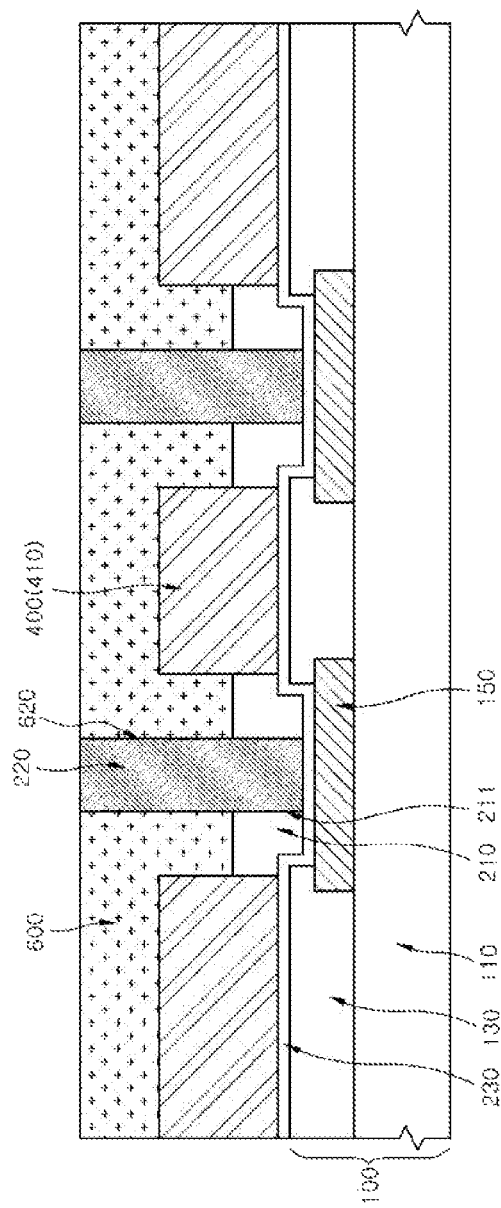
Figure 22:
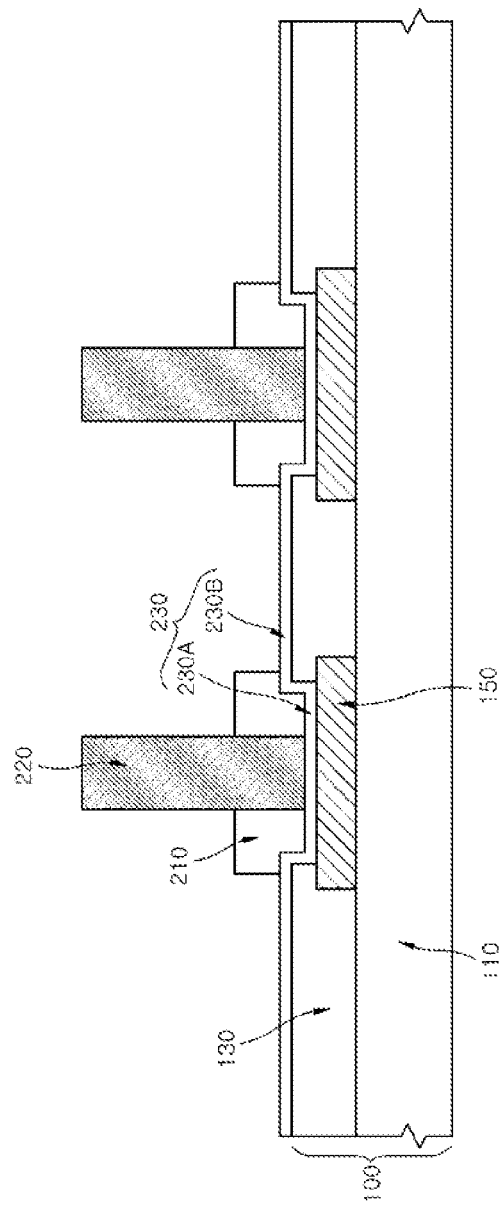

FIGS. 21 and 22 are schematic cross-sectional views illustrating the step S25 of forming the metal post 220 of the step S20 of forming the bumps in the method of manufacturing the semiconductor device of FIG. 13. FIG. 21 illustrates the step S25 of forming the metal posts 220, and FIG. 22 illustrates the step of removing the first and second resist patterns 400 and 600.

Referring to FIG. 21, a second plating process of plating a metal material may be performed. A metal material may be plated and grown from a portion of the seed metal layer 230 that is exposed in the second opening 620 of the second resist pattern 600 by using the seed metal layer 230 as a plating seed layer. The metal material such as copper (Cu) may be plated. The metal material may fill the second opening 620 to form the metal posts 220 in the second opening 620.

After the metal post 220 is formed, the first and second resist patterns 400 and 600 may be removed, as illustrated in FIG. 22. As the first and second resist patterns 400 and 600 are removed, a portion 230B of the seed metal layer 230 thereunder may be exposed. The exposed portion 230B of the seed metal layer 230 may be selectively etched or removed. The other portions 230A of the seed metal layer 230 that overlap with the solder layer 210 and the metal post 220 may remain. Bumps (200 in FIG. 3) may be formed on the first substrate 100 through the detailed process as described above.

Figure 23:
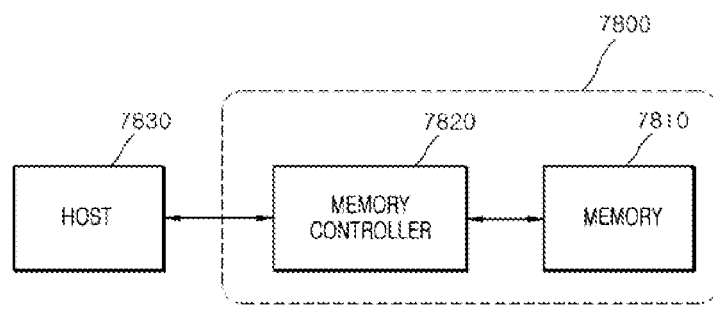
FIG. 23 is a block diagram illustrating an electronic system employing a memory card including a package according to an embodiment of the present disclosure.

FIG. 23 is a block diagram illustrating an electronic system including a memory card 7800 employing at least one of the semiconductor packages according to the embodiments. The memory card 7800 may include a memory 7810, such as a nonvolatile memory device, and a memory controller 7820. The memory 7810 and the memory controller 7820 may store data or read out the stored data. At least one of the memory 7810 and the memory controller 7820 may include at least one of the semiconductor packages according to the embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 24:
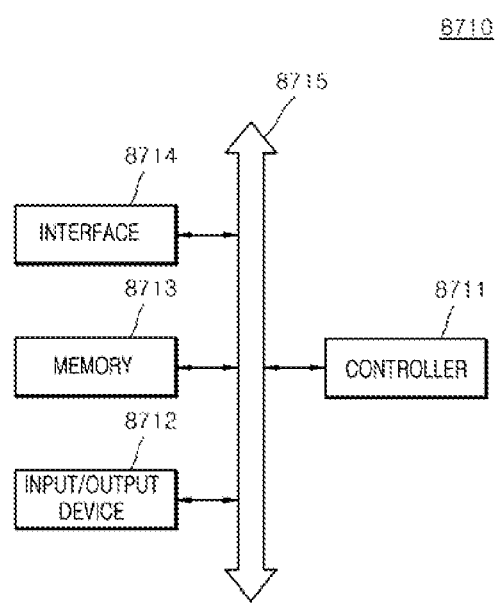
FIG. 24 is a block diagram illustrating an electronic system including a package according to an embodiment of the present disclosure.

FIG. 24 is a block diagram illustrating an electronic system 8710 including at least one of the semiconductor packages according to the embodiments. The electronic system 8710 may include a controller 8711, an input/output device 8712, and a memory 8713. The controller 8711, the input/output device 8712, and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include at least one of the semiconductor packages according to the embodiments of the present disclosure. The input/output device 8712 may include at least one selected among a keypad, a keyboard, a display device, a touchscreen and so forth. The memory 8713 may be a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

If the electronic system 8710 is an equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDMA (wideband code division multiple access), CDMA2000, LTE (long term evolution) or Wibro (wireless broadband Internet).

The inventive concept has been disclosed in conjunction with some embodiments as described above. Those skilled in the art will appreciate that various modifications, additions and substitutions are possible, without departing from the scope and spirit of the present disclosure. Accordingly, the embodiments disclosed in the present specification should be considered from not a restrictive standpoint but an illustrative standpoint. The scope of the inventive concept is not limited to the above descriptions but defined by the accompanying claims, and all of distinctive features in the equivalent scope should be construed as being included in the inventive concept.

What is claimed is:

1. A method of manufacturing a semiconductor device, the method comprising:
    forming a substrate including a connection pad;
    forming a first resist pattern on the connection pad of the substrate, the first resist pattern including a ring-shaped first opening;
    forming a ring pattern of a solder layer with an inserting hole by filling the ring-shaped first opening with a solder material;
    selectively removing a portion of the first resist pattern that fills the inserting hole;
    forming a second resist pattern with a second opening that substantially overlaps with the inserting hole; and
    filling the second opening with a metal material to form a metal post, the metal post with an inserting portion that is inserted into the inserting hole and a protruding portion that protrudes outside of the ring pattern of the solder layer.

2. The method of claim 1, further comprising, before forming the first resist pattern, forming a seed metal layer that covers the connection pad of the substrate and extends onto the first substrate.

3. The method of claim 1, wherein the solder layer is formed by plating the solder material.

4. The method of claim 1, wherein the metal post is formed by plating the metal material.

5. The method of claim 1, wherein selectively removing the portion of the first resist pattern that fills the inserting hole includes:
    selectively irradiating an exposure light that is exposed to the portion of the first resist pattern that fills the inserting hole; and
    developing the exposed portion of the first resist pattern.

6. A method of manufacturing a semiconductor device, the method comprising:
    forming a first substrate including a connection pad;
    forming a bump on the connection pad, wherein the bump includes a solder layer and a metal post, and the solder layer has a ring pattern with an inserting hole, and wherein the metal post includes an inserting portion that is inserted into the inserting hole of the ring pattern and a protruding portion protruding out of the ring pattern;
    forming a second substrate including a bump land;
    disposing the first substrate over the second substrate such that the protruding end of the metal post contacts the bump land; and
    reflowing the solder layer to interconnect the metal post to the bump land.

7. The method of claim 6, wherein the reflowing of the solder layer is performed such that the solder layer flows down along a side surface of the metal post to form a side surface of the solder layer that is curved around the metal post.

8. The method of claim 6,
    wherein the bump land includes a concave groove, and
    wherein the first substrate is disposed over the second substrate such that the protruding end of the metal post is inserted into the concave groove.

9. The method of claim 6, wherein the solder layer includes tin (Sn), a tin-silver (SnAg) alloy, or a tin-silver-gold (AuSnAg) alloy.

10. The method of claim 6, wherein the metal post includes copper (Cu).

11. The method of claim 6, wherein the first substrate includes a semiconductor die.

12. The method of claim 11, wherein the second substrate includes a packaging substrate on which the semiconductor die is mounted.

13. The method of claim 6, wherein forming the bumps includes:
    forming a first resist pattern on the connection pad of the first substrate, the first resist pattern including a ring-shaped first opening;
    forming the solder layer in a ring pattern with an inserting hole by filling the ring-shaped first opening with a solder material;
    selectively removing a portion that fills the inserting hole of the first resist pattern;
    forming a second resist pattern with a second opening that substantially overlaps with the inserting hole; and
    filling the second opening with a metal material to form the metal post.

14. The method of claim 13, further comprising, before forming the first resist pattern, forming a seed metal layer that covers the connection pad of the first substrate and extends onto the first substrate.

15. The method of claim 13, wherein the solder layer is formed by plating the solder material.

16. The method of claim 13, wherein the metal post is formed by plating the metal material.

17. The method of claim 13, wherein selectively removing the portion that fills the inserting hole of the first resist pattern includes:
    selectively irradiating an exposure light that is exposed to a portion that fills the inserting hole of the first resist pattern; and
    developing the exposed portion of the first resist pattern.

18. The method of claim 6, wherein the solder layer is formed on the connection pad.

19. The method of claim 18, wherein
    the protruding portion extends from the inserting portion.

20. The method of claim 19, wherein the reflowing of the solder layer includes the solder layer flowing down to cover at least a portion of a side surface of the protruding portion of the metal post to be bonded to the bump land.

* * * * *